United States Patent
Meng et al.

(10) Patent No.: US 10,411,661 B1
(45) Date of Patent: Sep. 10, 2019

(54) APPARATUS, SYSTEM AND METHOD FOR POWER AMPLIFIER CONTROL

(71) Applicant: BEIJING HUNTERSUN ELECTRONIC CO., LTD., Beijing (CN)

(72) Inventors: Hao Meng, Beijing (CN); Yongxue Qian, Beijing (CN); Tin Wai Kwan, Oak Park, CA (US)

(73) Assignee: BEIJING HUNTERSUN ELECTRONIC CO., LTD., Beijing (CN)

( * ) Notice: Subject to any disclaimer, the term of this patent is extended or adjusted under 35 U.S.C. 154(b) by 0 days.

(21) Appl. No.: 15/995,656

(22) Filed: Jun. 1, 2018

(51) Int. Cl.
*H03G 3/20* (2006.01)
*H03F 3/21* (2006.01)
*H03F 3/195* (2006.01)
*H03F 3/213* (2006.01)
*H03F 1/30* (2006.01)
*H03F 1/02* (2006.01)

(52) U.S. Cl.
CPC ........... *H03F 3/211* (2013.01); *H03F 1/0211* (2013.01); *H03F 1/302* (2013.01); *H03F 3/195* (2013.01); *H03F 3/213* (2013.01)

(58) Field of Classification Search
CPC ..................................................... H03G 3/20
USPC .................................................. 330/133, 310
See application file for complete search history.

(56) References Cited

U.S. PATENT DOCUMENTS

| | | | | |
|---|---|---|---|---|
| 6,822,511 | B1* | 11/2004 | Doherty ............... | H03F 1/0261 330/127 |
| 7,193,459 | B1* | 3/2007 | Epperson ................ | H03C 5/00 330/130 |
| 2002/0057131 | A1* | 5/2002 | Matsushita ........... | H03F 1/0233 330/133 |
| 2003/0001676 | A1* | 1/2003 | Matsushita ............. | H03F 1/301 330/285 |
| 2003/0016082 | A1* | 1/2003 | Matsunaga ........... | H03F 1/0261 330/133 |
| 2006/0208796 | A1* | 9/2006 | Nellis ................... | H03F 1/0205 330/133 |
| 2007/0046370 | A1* | 3/2007 | Matsumoto ............... | H03F 1/30 330/133 |

* cited by examiner

*Primary Examiner* — Henry Choe
(74) *Attorney, Agent, or Firm* — Harness, Dickey & Pierce, P.L.C.

(57) ABSTRACT

An apparatus for power amplifier control is provided, applied to a multi-stage power amplifier. The apparatus controls an input voltage of an amplification triode in the first amplification stage, by using a detected current change at a base of an amplification triode in the last amplification stage, achieving control of output power and a maximum output current of the multi-stage power amplifier, greatly reducing an influence of current detection on maximum output power and maximum output efficiency of the power amplifier.

13 Claims, 6 Drawing Sheets

APPARATUS, SYSTEM AND METHOD FOR POWER AMPLIFIER CONTROL

TECHNICAL FIELD

The present disclosure relates to the technical field of power amplifiers, and in particular, to an apparatus, a system and a method for power amplifier control.

BACKGROUND

Due to a more and more complicated design principle of an intelligent mobile phone at present, various radio frequency devices, such as an antenna tuner in an antenna, a complicated antenna switch, a filter, a duplexer, a diplexer and a directional coupler, are required to be added between a power amplifier and an antenna, which result in an increased power loss between the power amplifier and the radio frequency devices.

In order to meet a requirement of the international standard (3GPP, 3rd Generation Partnership Project) on lowest power of an antenna interface, a manufacturer may generally enlarge output power of the power amplifier. For example, in a high-end intelligent mobile phone at present, highest output power of a GSM (Global System for Mobile Communication) power amplifier generally exceeds 36 dBm. A peak envelope current of the power amplifier may be as high as 2.5 A in a case of a load of 50 ohm, and may exceed 4 A in case of a severe mismatch of load. If the output power and a current of the power amplifier are not limited, the power amplifier may be damaged due to overheat, thereby resulting in malfunction of the mobile phone.

SUMMARY

To address an issue in conventional technology, an apparatus, a system and a method for power amplifier control are provided according to the present disclosure, to limit output power and an output current of a power amplifier, so as to prevent an overheat damage of the power amplifier.

An apparatus for power amplifier control according to an embodiment of the present disclosure is applied to a multi-stage power amplifier. The multi-stage power amplifier includes N amplification stages, and N≥2. An input end of the first amplification stage is an input end of the multi-stage power amplifier. An output end of the first amplification stage is connected, directly or via at least one intermediate amplification stage, to an input end of the N-th amplification stage. An output end of the N-th amplification stage is an output end of the multi-stage power amplifier. The first amplification stage includes a first triode. The N-th amplification stage includes an N-th triode. A base of the first triode is connected to the input end of the multi-stage power amplifier. A collector of the first triode is connected to a first input voltage and connected, directly or via the at least one intermediate amplification stage, to a base of the N-th triode. An emitter of the first triode is grounded. A collector of the N-th triode is connected to an N-th input voltage and the output end of the multi-stage power amplifier. An emitter of the N-th triode is grounded. The apparatus includes a current detection unit and a controller. The current detection unit is configured to detect a current at the base of the N-th triode, to acquire a reference current value. The controller is configured to control the first input voltage, based on a change of the reference current value.

Optionally, the controller includes a voltage stabilizer. An input end of the voltage stabilizer is connected to a power supply, a control end of the voltage stabilizer is connected to an output end of the current detection unit, and an output end of the voltage stabilizer is connected to the collector of the first triode.

Optionally, the current detection unit includes a sensing resistor and an amplifier. A first end of the sensing resistor is connected to the base of the N-th triode, and a second end of the sensing resistor is connected to a power supply. An inverting input end of the amplifier is connected to the first end of the sensing resistor, a non-inverting input end of the amplifier is connected to the second end of the sensing resistor, and an output end of the amplifier is connected to the output end of the current detection unit.

Optionally, the voltage stabilizer is a linear stabilizer.

A system for power amplifier control according to an embodiment of the present disclosure includes a multi-stage power amplifier and a control module. The multi-stage power amplifier includes N amplification stages, and N≥2. An input end of the first amplification stage is an input end of the multi-stage power amplifier. An output end of the first amplification stage is connected, directly or via at least one intermediate amplification stage, to an input end of the N-th amplification stage. An output end of the N-th amplification stage is an output end of the multi-stage power amplifier. The first amplification stage includes a first triode. The N-th amplification stage includes an N-th triode. A collector of the first triode is connected to an output end of the control module and connected, directly or via the at least one intermediate amplification stage, to a base of the N-th triode. A base of the first triode is connected to the input end of the multi-stage power amplifier. An emitter of the first triode is grounded. A collector of the N-th triode is connected to an N-th input voltage and the output end of the multi-stage power amplifier, and an emitter of the N-th triode is grounded. An input end of the control module is connected to the base of the N-th triode, and the control module is configured to control a voltage outputted to the collector of the first triode, based on a change of a current at the base of the N-th triode.

Optionally, the control module includes a current detection unit and a controller. An input end of the current detection unit is connected to the base of the N-th triode, and an output end of the current detection unit is connected to a first input end of the controller. A second input end of the controller is connected to a power supply, and an output end of the controller is connected to the collector of the first triode.

Optionally, the controller includes a voltage stabilizer. A control end of the voltage stabilizer is connected to the output end of the current detection unit, an input end of the voltage stabilizer is connected to the power supply, and an output end of the voltage stabilizer is connected to the collector of the first triode.

Optionally, the current detection unit includes a sensing resistor and an amplifier. A first end of the sensing resistor is connected to the base of the N-th triode, and a second end of the sensing resistor is connected to a power supply. An inverting input end of the amplifier is connected to the first end of the sensing resistor, a non-inverting input end of the amplifier is connected to the second end of the sensing resistor, and an output end of the amplifier is connected to the output end of the current detection unit.

Optionally, the voltage stabilizer is a linear stabilizer.

A method for power amplifier control according to an embodiment of the present disclosure is applied to a multi-stage power amplifier. The multi-stage power amplifier includes N amplification stages, and N≥2. An input end of the first amplification stage is an input end of the multi-stage power amplifier. An output end of the first amplification stage is connected, directly or via at least one intermediate amplification stage, to an input end of the N-th amplification stage. An output end of the N-th amplification stage is an output end of the multi-stage power amplifier. The first amplification stage includes a first triode. The N-th amplification stage includes an N-th triode. A base of the first triode is connected to the input end of the multi-stage power amplifier. A collector of the first triode is connected to a first input voltage and connected, directly or via the at least one intermediate amplification stage, to a base of the N-th triode. An emitter of the first triode is grounded. A collector of the N-th triode is connected to an N-th input voltage and the output end of the multi-stage power amplifier, and an emitter of the N-th triode is grounded. The method includes: detecting a current at the base of the N-th triode to acquire a reference current value, and controlling the first input voltage, based on a change of the reference current value.

Optionally, the controlling the first input voltage based on a change of the reference current value includes: controlling the first input voltage to decrease, in a case that the reference current value increases, and controlling the first input voltage to increase, in a case that the reference current value decreases.

In comparison with conventional technology, the technical solution in the present disclosure has at least the following advantages.

The apparatus for power amplifier control according to an embodiment of the present disclosure is applied to the multi-stage power amplifier. The current at a base of an amplification triode in the last amplification stage of the multi-stage power amplifier is detected by the current detection unit. The input voltage at the collector of the amplification triode in the first amplification stage is controlled by the controller based on a detection result of the current detection unit, to limit output power and an output current of the multi-stage power amplifier, so as to prevent an overheat damage of the power amplifier. Because a base current of a triode is linear to a collector current of the triode, the base current can reflect a condition of the collector current. Therefore, an output condition of the multi-stage power amplifier, at a collector of the amplification triode in the last amplification stage, can be reflected by a current at the base of the amplification triode in the last amplification stage. Based on the output condition, the first input voltage of the amplification triode in the first amplification stage is controlled, and thus amplitude of output power of the first amplification stage is controlled, and thereby the output power and the current of the multi-stage power amplifier are controlled. In addition, because the base current of the triode is much less than the collector current of the triode, a power consumed for detecting the base current of the amplification triode is much less than a power consumed for detecting the collector current, reducing an influence of current detection on maximum output power and maximum output efficiency of the power amplifier.

BRIEF DESCRIPTION OF THE DRAWINGS

For clearer illustration of the technical solutions according to embodiments of the present disclosure or conventional techniques, hereinafter are briefly described the drawings to be used in description of embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION OF THE EMBODIMENTS

For those skilled in the art to better understand the solution of the present disclosure, the technical solutions according to the embodiments of the present application will be described clearly and completely as follows in conjunction with the drawings in the embodiments of the present application. It is apparent that the described embodiments are only a part of the embodiments according to the present application, rather than all the embodiments. Any other embodiments obtained by those skilled in the art based on the embodiments in the present application without any creative efforts fall within the protection scope of the present application.

For ease of understanding, a structure of a multi-stage power amplifier is firstly introduced. It is understood that a multi-stage amplifier includes N amplification stages, where N≥2 and N is a positive integer. A three-stage power amplifier, i.e., N=3, is taken as an example hereinafter to illustrate the structure of the multi-stage power amplifier.

Figure 1:
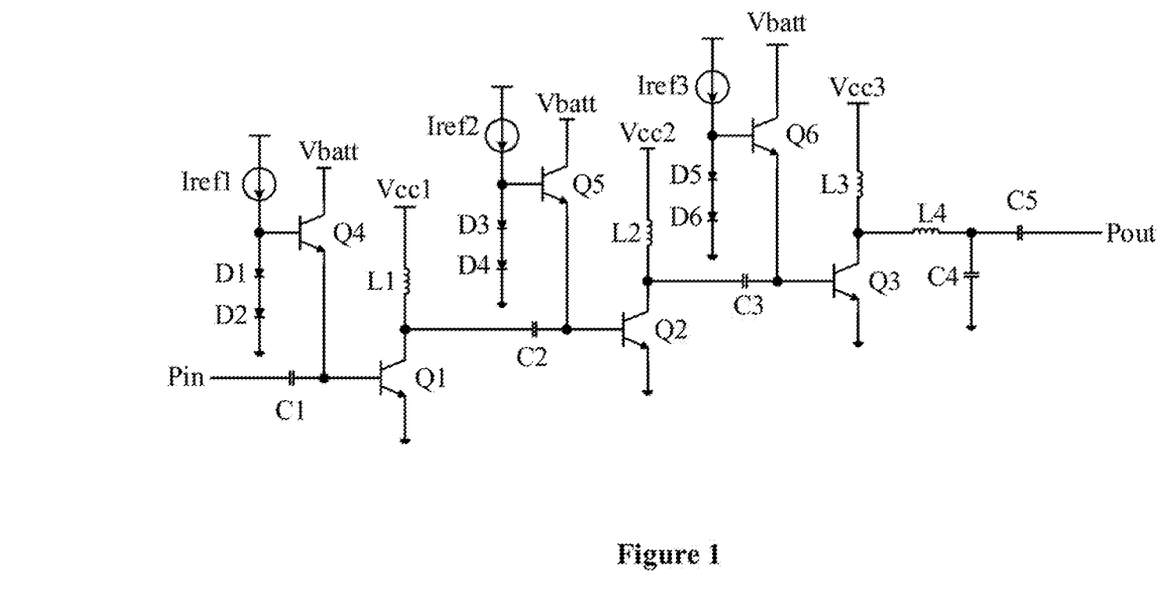
FIG. 1 is a schematic diagram of an application scene for an embodiment of the present disclosure.

Reference is made to FIG. 1, which is circuit topography of a three-stage power amplifier.

Three amplification stages of the three-stage power amplifier are the first amplification stage, the second amplification stage, and the third amplification stage, respectively. The first amplification stage includes a first triode Q1 and a first bias circuit, the second amplification stage includes a second triode Q2 and a second bias circuit, and the third amplification stage includes a third triode Q3 and a third bias circuit.

A base of the first triode Q1 is connected, via a first capacitor C1, to an input end Pin of the three-stage power amplifier. An emitter of the first triode Q1 is grounded. A collector of the first triode Q1 is connected, via a first inductor L1, to a first input voltage Vcc1.

The first bias circuit includes a fourth triode Q4, a first current source Iref1, a first diode D1 and a second diode D2. A base of the fourth triode Q4 is connected to an output end of the first current source Iref1, a collector of the fourth triode Q4 is connected to a power supply voltage Vbatt, and an emitter of the fourth triode Q4 is connected to the base of the first triode Q1. The output end of the first current source Iref1 is connected to an anode of the first diode D1, a cathode of the first diode D1 is connected to an anode of the second diode D2, and a cathode of the second diode D2 is grounded.

A base of the second triode Q2 is connected, via a second capacitor C2, to the collector of the first triode Q1. An emitter of the second triode Q2 is grounded. A collector of the second triode Q2 is connected, via a second inductor L2, to a second input voltage Vcc2.

The second bias circuit includes a fifth triode Q5, a second current source Iref2, a third diode D3 and a fourth diode D4. A base of the fifth triode Q5 is connected to an output end of the second current source Iref2, a collector of the fifth triode Q5 is connected to the power supply voltage Vbatt, and an emitter of the fifth triode Q5 is connected to the base of the second triode Q2. The output end of the second current source Iref2 is connected to an anode of the third diode D3, a cathode of the third diode D3 is connected to an anode of the fourth diode D4, and a cathode of the fourth diode D4 is grounded.

A base of the third triode Q3 is connected, via a third capacitor C3, to the collector of the second triode Q2. An emitter of the third triode Q3 is grounded. A collector of the third triode Q3 is connected, via a third inductor L3, to a third input voltage Vcc3. The collector of the third triode Q3 is connected, sequentially via a fourth inductor L4, a first end of a fourth capacitor C4, and a fifth capacitor C5, to an output end Pout of the multi-stage power amplifier. The second end of the fourth capacitor C4 is grounded.

The third bias circuit includes a sixth triode Q6, a third current source Iref3, a fifth diode D5 and a sixth diode D6. A base of the sixth triode Q6 is connected to an output end of the third current source Iref3, a collector of the sixth triode Q6 is connected to the power supply voltage Vbatt, and an emitter of the sixth triode Q6 is connected to the base of the third triode Q3. The output end of the third current source Iref3 is connected to an anode of the fifth diode D5, a cathode of the fifth diode D5 is connected to an anode of the sixth diode D6, and a cathode of the sixth diode D6 is grounded.

At present, output power and an output current of the power amplifier is generally controlled by adjusting an input voltage of the first amplification stage (i.e., the first input voltage connected to the collector of the first triode Q1) based on an actual output current (i.e., a collector current of the third triode Q3) of the power amplifier, thereby achieving control of the output power of the power amplifier. However, for detecting the actual output current, a current detection unit is connected to the collector of the third triode Q3, which results in a large power loss and thus a decrease of a voltage at the collector of the third triode Q3, influencing maximum output power and maximum output efficiency of the power amplifier.

Therefore, an apparatus for power amplifier control is provided according to an embodiment of the present disclosure. The apparatus detects a base current of an amplification triode (the third triode Q3 as shown in FIG. 1) in the last amplification stage of the multi-stage power amplifier, and adjusts the first input voltage inputted into a collector of an amplification triode (the first triode Q1 as shown in FIG. 1) in the first amplification stage based on the base current and a linear relationship between a base current and a collector current of a triode, so as to limit the output power and a peak envelope current of the power amplifier, and prevent an overheat damage of a device caused by an overlarge current. Because the base current is much less than the collector current, the power loss resulted from the current detection unit is greatly reduced according to an embodiment of the present disclosure, ensuring the maximum output power and the maximum output efficiency of the power amplifier.

Based on the above concept, to make the object, technical solutions and advantages of the present application clearer, embodiments of the present disclosure are illustrated in detail hereinafter with reference to the drawings.

It is noted that, the aforementioned structure of the multi-stage amplifier is only an example for illustration. The apparatus, the system and the method for power amplifier control according to embodiments of the present disclosure are not only applicable to the three-stage power amplifier as shown in FIG. 1, but also applicable to any type of multi-stage power amplifier (for example, an output end of the first amplification stage is directly connected to an input end of the second amplification stage, or an output end of the first amplification stage is connected via multiple intermediate stages to an input end of the second amplification stage), for limiting the output power and the peak envelope current of the multi-stage power amplifier. Structures of the multi-stage amplifier are not enumerated herein. For convenience of illustration, the three-stage power amplifier, i.e., N=3, is taken as an example hereinafter to illustrate an implementation of the embodiment of the present disclosure in detail. Implementations for multi-stage power amplifiers of other structures are similar to the example. For detailed description, one may refer to relevant illustration of the example, which is not repeated here.

Figure 2:
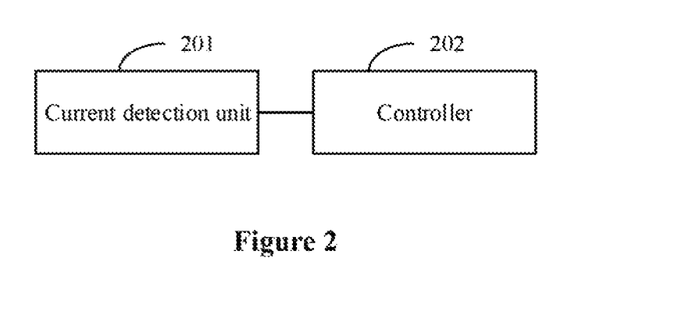
FIG. 2 is a schematic structural diagram of an apparatus for power amplifier control according to an embodiment of the present disclosure.

Reference is made to FIG. 2, which is a schematic structural diagram of an apparatus for power amplifier control according to an embodiment of the present disclosure.

An apparatus for power amplifier control according to an embodiment of the present disclosure includes a current detection circuit 201 and a controller 202.

The current detection unit 201 is configured to detect a current at the base of the third triode Q3 to acquire a reference current value.

The controller 202 is configured to control the first input voltage Vcc1 at the collector of the first triode Q1, based on a change of the reference current value.

From a property of a triode, it can be learned that a base current of the triode is linear to a collector current of the triode, and the base current of the triode is also linear to an emitter current of the triode. Therefore, in the embodiment of the present disclosure, the current detection unit 201 detects a base current of the third triode Q3. Then the collector current of the third triode Q3, i.e., an output current of the controlled multi-stage power amplifier can be determined based on a linear relationship between the base current and the collector current.

The controller 202 can determine the condition of the output current of the controlled multi-stage power amplifier based on the reference current value acquired by the current detection unit 201 detecting the base current of the third triode Q3. Then based on the reference current value, the controller 202 controls the first input voltage Vcc1 inputted into the collector of the first triode Q1, to control the output power of the first amplification stage, and thereby control the output power of the third amplification stage and the peak envelope current outputted from the controlled multi-stage amplifier to a load, In this way, the output power and a current of the power amplifier are limited, preventing the power amplifier and the load from a damage due to overheat.

In addition, because a current value of a base of a triode is much less than a current value of a collector and a current value of an emitter, a power consumed by the current detection unit 201 for detecting the base current of the third triode Q3 is much less than a power consumed for detecting the collector current or the emitter current of the third triode Q3. Therefore, a voltage drop caused by the current detection unit is reduced, ensuring output power and output efficiency of the third amplification stage, and thereby ensuring the maximum output power and the maximum output efficiency of the controlled multi-stage amplifier.

Figure 3:
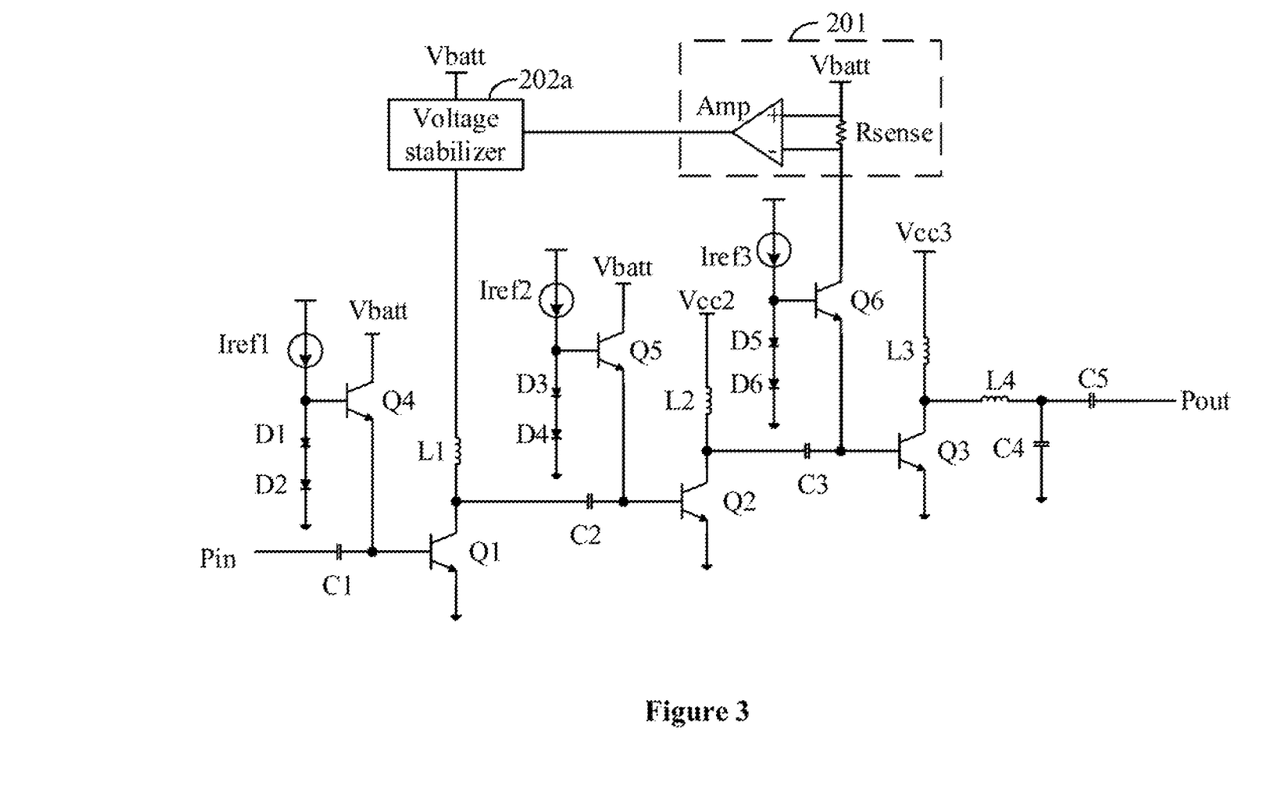
FIG. 3 is a schematic structural diagram of another apparatus for power amplifier control according to an embodiment of the present disclosure.

In some possible implementations of the embodiment of the present disclosure, as shown in FIG. 3, the controller 202 includes a voltage stabilizer 202a.

An input end of the voltage stabilizer 202a is connected to the power supply Vbatt, a control end of the voltage stabilizer 202a is connected to an output end of the current detection unit 201, and an output end of the voltage stabilizer 202a is connected to the collector of the first triode Q1.

It can be understood that, an operation principle of the voltage stabilizer 202a may be summarized as that an output voltage of the voltage stabilizer 202a is controlled to decrease in a case that an input current at an input end of the voltage stabilizer 202a increases, so that an output of the voltage stabilizer 202a is stabilized within a certain range. Therefore, in some possible implementations of the embodiment of the present disclosure, the first input voltage Vcc1 inputted into the collector of the first triode Q1 can be controlled by using the voltage stabilizer 202a, so as to achieve the limiting of the output power and the peak envelope current of the controlled multi-stage power amplifier. In practices, the voltage stabilizer 202a may be a linear stabilizer.

A control principle is described as follows. In a case that the base current of the third triode Q3 detected by the current detection unit 201 increases, a current outputted from the current detection unit 201 to the voltage stabilizer 202a increases, to control the voltage stabilizer 202a to decrease the first input voltage Vcc1 outputted to the collector of the first triode Q1, thereby decreasing output power of the first amplification stage, and thus decreasing the output power and the peak current of the controlled multi-stage power amplifier, so as to achieve the limiting of the output power and the peak current of the controlled multi-stage power amplifier. Conversely, in a case that the base current of the third triode Q3 detected by the current detection unit 201 decreases, an current outputted from the current detection unit 201 to the voltage stabilizer 202a decreases, to control the voltage stabilizer 202a to increase the first input voltage Vcc1 outputted to the collector of the first triode Q1, thereby increasing output power of the first amplification stage, and thus increasing the output power and the peak current of the controlled multi-stage power amplifier, so as to stabilize the output power and the current of the controlled multi-stage power amplifier.

Reference is further made to FIG. 3. In some possible implementations of the embodiment of the present disclosure, the current detection unit 201 includes a sensing resistor Rsense and an amplifier Amp.

A first end of the sensing resistor Rsense is connected to the base of the third triode Q3, and a second end of the sensing resistor Rsense is connected to the power supply Vbatt.

In practices, the base current of the third triode Q3 may be detected via the third bias circuit. In this case, the first end of the sensing resistor Rsense is connected to the collector of the sixth triode Q6.

An inverting input end of the amplifier Amp is connected to the first end of the sensing resistor Rsense, a non-inverting input end of the amplifier Amp is connected to the second end of the sensing resistor Rsense, and an output end of the amplifier Amp is connected to the output end of the current detection unit 201.

In an embodiment of the present disclosure, detection of the base current of the third triode Q3 is achieved by using a voltage difference generated on the sensing resistor Rsense when the base current of the third triode Q3 flows through the sensing resistor Rsense. The amplifier Amp collects the voltage difference between two ends of the sensing resistor Rsense, amplifies the voltage difference and outputs the amplified voltage difference to the controller 202, so that the controller can control the first input voltage Vcc1 outputted to the collector of the first triode Q1 based on the base current of the third triode Q3, achieving the limiting of the output power and the current of the controlled multi-stage amplifier.

The apparatus for power amplifier control according to this embodiment of the present disclosure is applied to the multi-stage power amplifier. The current at a base of an amplification triode in the last amplification stage of the multi-stage power amplifier is detected by the current detection unit. The first input voltage at the collector of the amplification triode in the first amplification stage is controlled by the controller based on a detection result of the current detection unit, to limit output power and an output current of the multi-stage power amplifier, so as to prevent an overheat damage of the power amplifier. Because a base current of a triode is linear to a collector current of the triode, the base current can reflect a condition of the collector current. Therefore, an output condition of the multi-stage power amplifier, at a collector of the amplification triode in the last amplification stage, can be reflected by a current at the base of the amplification triode in the last amplification stage. Based on the output condition, the first input voltage of the amplification triode in the first amplification stage is controlled, and thus amplitude of output power of the first amplification stage is controlled, and thereby the output power and the current of the multi-stage power amplifier are controlled. In addition, because the base current of the triode is much less than the collector current of the triode, a power consumed for detecting the base current of the amplification triode is much less than a power consumed for detecting the collector current, reducing an influence of current detection on maximum output power and maximum output efficiency of the power amplifier.

Based on the apparatus for power amplifier control according to the aforementioned embodiment, a system for power amplifier control is further provided according to an embodiment of the present disclosure.

Figure 4:
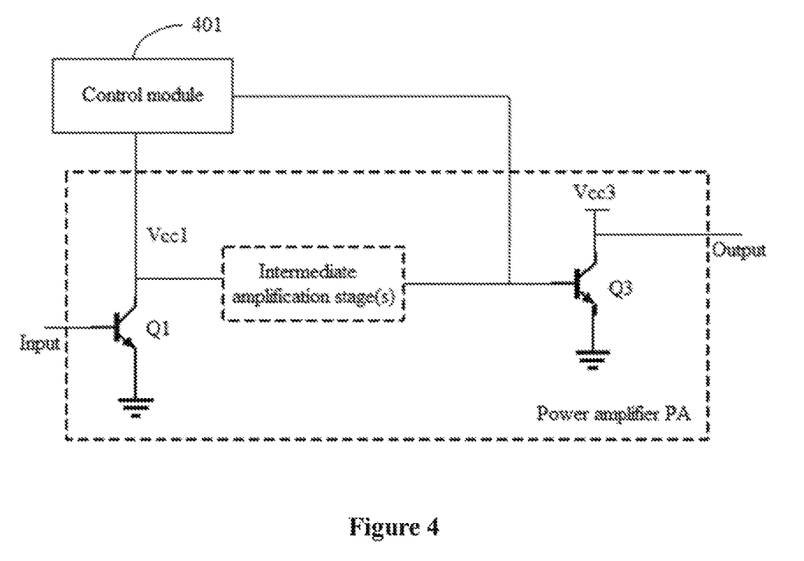
FIG. 4 is a schematic structural diagram of a system for power amplifier control according to an embodiment of the present disclosure.

Reference is made to FIG. 4, which is a schematic structural diagram of a system for power amplifier control according to an embodiment of the present disclosure.

The system for power amplifier control according to the embodiment of the present disclosure includes a multi-stage power amplifier PA and a control module 401.

The multi-stage power amplifier PA includes N amplification stages, where N≥2 and N is a positive integer.

An input end of the first amplification stage is an input end of the multi-stage power amplifier PA. An output end of the first amplification stage is connected, directly or via at least one intermediate amplification stage, to an input end of the N-th amplification stage. An output end of the N-th amplification stage is an output end of the multi-stage power amplifier PA.

The three-stage power amplifier, i.e., N=3, is still taken as an example hereinafter to illustrate an implementation of the embodiment of the present disclosure in detail. Implementations of multi-stages power amplifiers of other structures are similar to the example. For detailed description, one may refer to relevant illustration of the example, which is not repeated here.

The first amplification stage includes a first triode Q1, and the third amplification stage includes a third triode Q3.

A collector of the first triode Q1 is connected to an output end of the control module 401 and connected, directly or via the at least one intermediate amplification stage, to a base of the third triode Q3. A base of the first triode Q1 is connected to the input end of the multi-stage power amplifier PA. An emitter of the first triode Q1 is grounded.

A collector of the third triode Q3 is connected to a third input voltage Vcc3 and the output end of the multi-stage power amplifier PA. An emitter of the third triode Q3 is grounded.

It is understood that a structure of the multi-stage power amplifier PA may be as described hereinabove. For detailed description, one may refer to relevant illustration, which is not repeated here. The number of the amplification stages and a structure of each amplification stage of the multi-stage power amplifier PA are not limited in the present disclosure.

In practices, an element (such as the first triode Q1 and the third triode Q3) for amplified output in each amplification stage of the multi-stage power amplifier PA may be a heterojunction bipolar transistor (HBT).

An input end of the control module 401 is connected to the base of the third triode Q3. The control module 401 is configured to control a voltage outputted to the collector of the first triode Q1 based on a change of the base current of the third triode Q3.

It is understood that the control module 401 in this embodiment of the present disclosure may be the apparatus for power amplifier control according to the aforementioned embodiment. For details of the structure, the operation principle and other relevant illustration of the control module 401, one may refer to the aforementioned embodiment, which is not repeated here.

Figure 5:
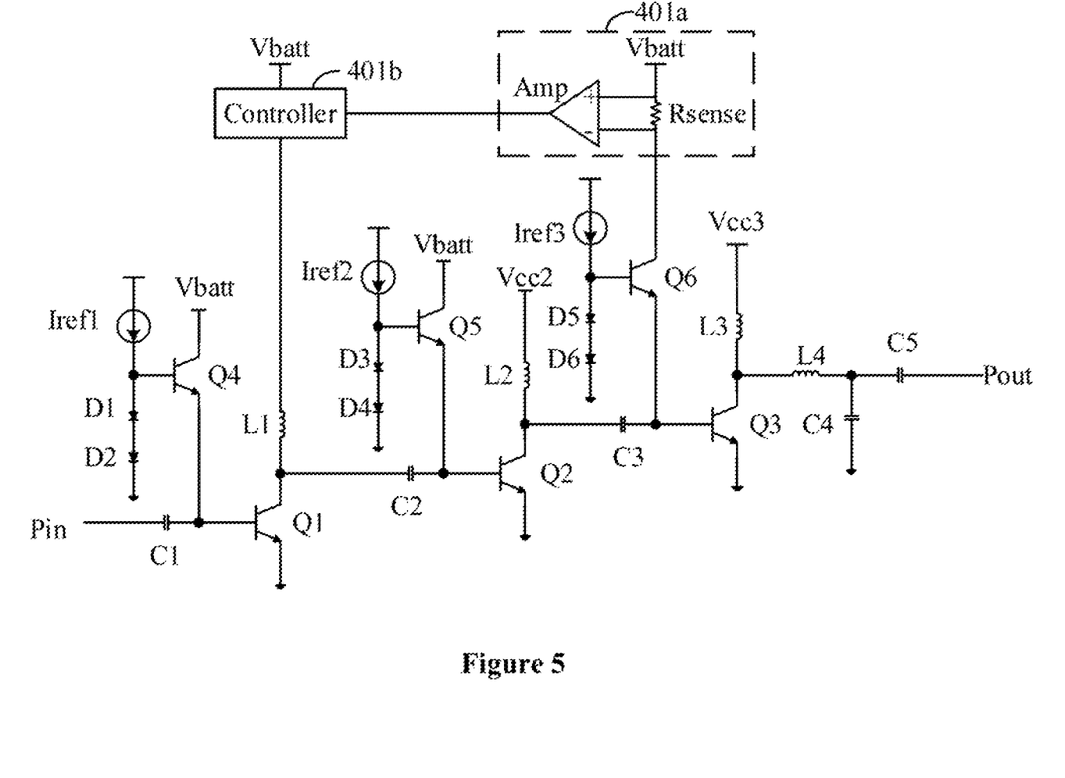
FIG. 5 is a schematic structural diagram of another system for power amplifier control according to an embodiment of the present disclosure.

In some possible implementations of the embodiment of the present disclosure, as shown in FIG. 5, the control module 401 may include a current detection unit 401a and a controller 401b.

An input end of the current detection unit 401a is connected to the base of the third triode Q3, and an output end of the current detection unit 401a is connected to a first input end of the controller 401b.

A second input end of the controller 401b is connected to the power supply Vbatt, and an output end of the controller 401b is connected to the collector of the first triode Q1.

As an example, the controller 401b may include a voltage stabilizer.

A control end of the voltage stabilizer is connected to the output end of the current detection unit 401a, an input end of the voltage stabilizer is connected to the power supply Vbatt, and an output end of the voltage stabilizer is connected to the collector of the first triode Q.

In practices, the voltage stabilizer may be a linear stabilizer.

Reference is further made to FIG. 5. In some possible implementations of the embodiment of the present disclosure, the current detection unit 401a includes a sensing resistor Rsense and an amplifier Amp.

A first end of the sensing resistor Rsense is connected to the base of the third triode Q3, and a second end of the sensing resistor Rsense is connected to the power supply Vbatt.

In practices, the base current of the third triode Q3 may be detected via a third bias circuit. In this case, the first end of the sensing resistor Rsense is connected to a collector of a sixth triode Q6.

An inverting input end of the amplifier Amp is connected to the first end of the sensing resistor Rsense, a non-inverting input end of the amplifier Amp is connected to the second end of the sensing resistor Rsense, and an output end of the amplifier Amp is connected to the output end of the current detection unit 401a.

The system for power amplifier control according to this embodiment of the present disclosure is applied to a multi-stage power amplifier. The current at a base of an amplification triode in the last amplification stage of the multi-stage power amplifier is detected by the current detection unit. The first input voltage at the collector of the amplification triode in the first amplification stage is controlled by the controller, based on a detection result of the current detection unit, to limit output power and an output current of the multi-stage power amplifier, so as to prevent an overheat damage of the power amplifier. Because a base current of a triode is linear to a collector current of the triode, the base current can reflect a condition of the collector current. Therefore, an output condition of the multi-stage power amplifier, at a collector of the amplification triode in the last amplification stage, can be reflected by a current at the base of the amplification triode in the last amplification stage. Based on the output condition, the first input voltage of the amplification triode in the first amplification stage is controlled, and thus amplitude of output power of the first amplification stage is controlled, and thereby the output power and the current of the multi-stage power amplifier are controlled. In addition, because the base current of the triode is much less than the collector current of the triode, a power consumed for detecting the base current of the amplification triode is much less than a power consumed for detecting the collector current, reducing an influence of current detection on maximum output power and maximum output efficiency of the power amplifier.

Based on the apparatus and the system for power amplifier control according to the aforementioned embodiments of the present disclosure, a method for power amplifier control is further provided according to an embodiment of the present disclosure.

Figure 6:
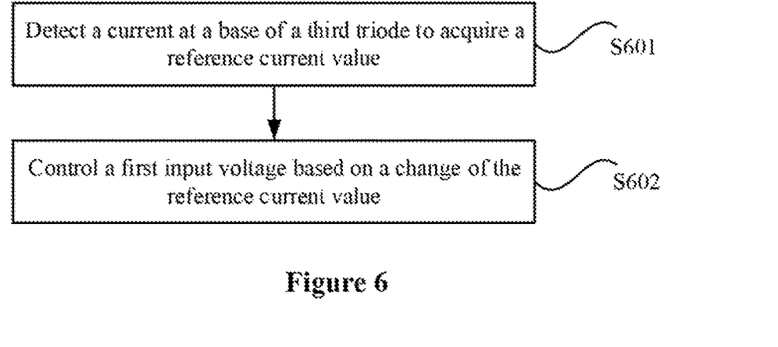
FIG. 6 is a schematic flowchart of a method for power amplifier control according to an embodiment of the present disclosure.

Reference is made to FIG. 6, which is a schematic flowchart of a method for power amplifier control according to an embodiment of the present disclosure.

The method for power amplifier control according to the embodiment of the present disclosure is applied to a multi-stage power amplifier. The multi-stage power amplifier includes N amplification stages, where N≥2 and N is a positive integer. An input end of the first amplification stage is an input end of the multi-stage power amplifier. An output end of the first amplification stage is connected, directly or via at least one intermediate amplification stage, to an input end of the N-th amplification stage. An output end of the N-th amplification stage is an output end of the multi-stage power amplifier.

For convenience of illustration, the three-stage power amplifier, i.e., N=3, is still taken as an example hereinafter to illustrate an implementation of the embodiment of the present disclosure in detail.

The first amplification stage includes a first triode. The third amplification stage includes a third triode. A base of the first triode is connected to the input end of the multi-stage power amplifier. A collector of the first triode is connected to a first input voltage and connected via the second amplification stage to a base of the third triode. An emitter of the first triode is grounded. A collector of the third triode is connected to a third input voltage and the output end of the multi-stage power amplifier. An emitter of the third triode is grounded. Reference may be made to FIG. 1 for details.

The method for power amplifier control according to this embodiment of the present disclosure may include the following steps S601 and S602.

In step S601, a current at the base of the third triode is detected to acquire a reference current value.

In step S602, the first input voltage is controlled based on a change of the reference current value.

Figure 7:
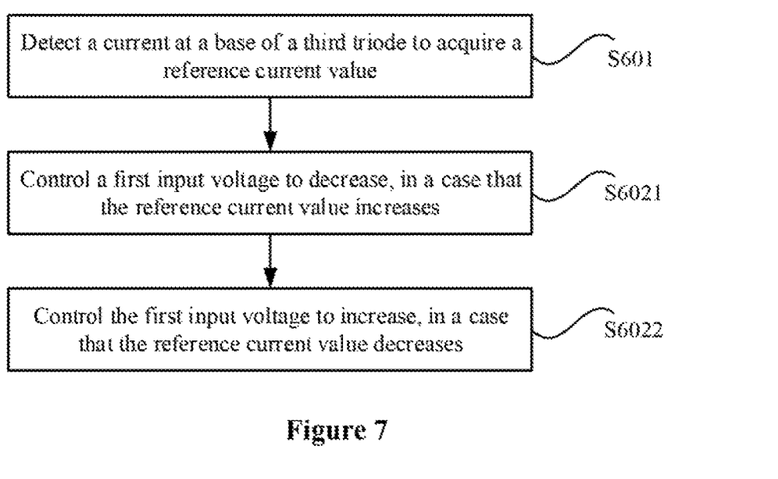
FIG. 7 is a schematic flowchart of another method for power amplifier control according to an embodiment of the present disclosure.

In some possible implementations of the embodiment of the present disclosure, as shown in FIG. 7, the aforementioned step S602 may include steps S6021 and S6022.

In step S6021, the first input voltage is controlled to decrease, in a case that the reference current value increases.

In step S6022, the first input voltage is controlled to increase, in a case that the reference current value decreases.

The method for power amplifier control according to an embodiment of the present disclosure is applied to the multi-stage power amplifier. The current at a base of an amplification triode in the last amplification stage of the multi-stage power amplifier is detected by the current detection unit. The first input voltage at the collector of the amplification triode in the first amplification stage is controlled by the controller based on a detection result of the current detection unit, to limit output power and an output current of the multi-stage power amplifier, so as to prevent an overheat damage of the power amplifier. Because a base current of a triode is linear to a collector current of the triode, the base current can reflect a condition of the collector current. Therefore, an output condition of the multi-stage power amplifier, at a collector of the amplification triode in the last amplification stage, can be reflected by a current at the base of the amplification triode in the last amplification stage. Based on the output condition, the first input voltage of the amplification triode in the first amplification stage is controlled, and thus amplitude of output power of the first amplification stage is controlled, and thereby the output power and the current of the multi-stage power amplifier are controlled. In addition, because the base current of the triode is much less than the collector current of the triode, a power consumed for detecting the base current of the amplification triode is much less than a power consumed for detecting the collector current, reducing an influence of current detection on maximum output power and maximum output efficiency of the power amplifier.

It should be noted that the embodiments of the present disclosure are described in a progressive manner, and each embodiment places emphasis on the difference from other embodiments. Therefore, the embodiments may be referred one to another for the same or similar parts. Since the system or the method disclosed in the embodiments corresponds to apparatus disclosed in the embodiments, the description of the system and the method is simple, and reference may be made to the relevant part of the apparatus.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other same elements may exist in the process, the method, the article or the device.

The steps of the method or algorithm described with reference to the embodiments herein can be implemented in forms of hardware, a software module executed by a processor or the combination thereof. The software module may be stored in a Random Access Memory (RAM), a memory, a Read-Only Memory (ROM), an electrically programmable ROM, an electrically erasable programmable ROM, a register, a hardware disk, a movable magnetic disk, CD-ROM or any other forms of storage medium well known in the art.

The foregoing embodiments are only preferred embodiments of the present disclosure, and are not intended to be limiting in any form. With the method and technical content disclosed above, those skilled in the art can make some changes and improvements to the technical solutions of the present disclosure, or make some equivalents to the embodiments without departing from the scope of technical solutions of the present disclosure. All simple modifications, equivalents and improvements made based on the technical essence of the present disclosure without departing the content of the technical solutions of the present disclosure fall within the protection scope of the technical solutions of the present disclosure.

The invention claimed is:

1. An apparatus for power amplifier control, applied to a multi-stage power amplifier, wherein:
   the multi-stage power amplifier comprises N amplification stages, and N≥2;
   an input end of the first amplification stage is an input end of the multi-stage power amplifier, an output end of the first amplification stage is connected, directly or via at least one intermediate amplification stage, to an input end of the N-th amplification stage, and an output end of the N-th amplification stage is an output end of the multi-stage power amplifier;
   the first amplification stage comprises a first triode;
   the N-th amplification stage comprises an N-th triode;
   a base of the first triode is connected to the input end of the multi-stage power amplifier, a collector of the first triode is connected to a first input voltage and connected, directly or via the at least one intermediate amplification stage, to a base of the N-th triode, and an emitter of the first triode is grounded;
   a collector of the N-th triode is connected to an N-th input voltage and the output end of the multi-stage power amplifier, and an emitter of the N-th triode is grounded;
   the apparatus comprises a current detection unit and a controller;
   the current detection unit is configured to detect a current at the base of the N-th triode, to acquire a reference current value; and
   the controller is configured to control the first input voltage based on a change of the reference current value.

2. The apparatus according claim 1, wherein:
   the controller comprises a voltage stabilizer; and
   an input end of the voltage stabilizer is connected to a power supply, a control end of the voltage stabilizer is connected to an output end of the current detection unit, and an output end of the voltage stabilizer is connected to the collector of the first triode.

3. The apparatus according to claim 1, wherein:
the current detection unit comprises a sensing resistor and an amplifier;
a first end of the sensing resistor is connected to the base of the N-th triode, and a second end of the sensing resistor is connected to a power supply; and
an inverting input end of the amplifier is connected to the first end of the sensing resistor, a non-inverting input end of the amplifier is connected to the second end of the sensing resistor, and an output end of the amplifier is connected to the output end of the current detection unit.

4. The apparatus according to claim 2, wherein:
the current detection unit comprises a sensing resistor and an amplifier;
a first end of the sensing resistor is connected to the base of the N-th triode, and a second end of the sensing resistor is connected to a power supply; and
an inverting input end of the amplifier is connected to the first end of the sensing resistor, a non-inverting input end of the amplifier is connected to the second end of the sensing resistor, and an output end of the amplifier is connected to the output end of the current detection unit.

5. The apparatus according to claim 2, wherein the voltage stabilizer is a linear stabilizer.

6. A system for power amplifier control, comprising a multi-stage power amplifier and a control module, wherein:
the multi-stage power amplifier comprises N amplification stages, and N≥0.2;
an input end of the first amplification stage is an input end of the multi-stage power amplifier, an output end of the first amplification stage is connected, directly or via at least one intermediate amplification stage, to an input end of the N-th amplification stage, and an output end of the N-th amplification stage is an output end of the multi-stage power amplifier;
the first amplification stage comprises a first triode;
the N-th amplification stage comprises an N-th triode;
a collector of the first triode is connected to an output end of the control module and connected, directly or via the at least one intermediate amplification stage, to a base of the N-th triode, a base of the first triode is connected to the input end of the multi-stage power amplifier, and an emitter of the first triode is grounded;
a collector of the N-th triode is connected to an N-th input voltage and the output end of the multi-stage power amplifier, and an emitter of the N-th triode is grounded; and
an input end of the control module is connected to the base of the N-th triode, and the control module is configured to control a voltage outputted to the collector of the first triode, based on a change of a current at the base of the N-th triode.

7. The system according claim 6, wherein: the control module comprises a current detection unit and a controller;
an input end of the current detection unit is connected to the base of the N-th triode, and an output end of the current detection unit is connected to a first input end of the controller; and
a second input end of the controller is connected to a power supply, and an output end of the controller is connected to the collector of the first triode.

8. The system according to claim 7, wherein:
the controller comprises a voltage stabilizer; and
a control end of the voltage stabilizer is connected to the output end of the current detection unit, an input end of the voltage stabilizer is connected to the power supply, and an output end of the voltage stabilizer is connected to the collector of the first triode.

9. The system according to claim 7, wherein: the current detection unit comprises a sensing resistor and an amplifier;
a first end of the sensing resistor is connected to the base of the N-th triode, and a second end of the sensing resistor is connected to a power supply; and
an inverting input end of the amplifier is connected to the first end of the sensing resistor, a non-inverting input end of the amplifier is connected to the second end of the sensing resistor, and an output end of the amplifier is connected to the output end of the current detection unit.

10. The system according to claim 8, wherein: the current detection unit comprises a sensing resistor and an amplifier;
a first end of the sensing resistor is connected to the base of the N-th triode, and a second end of the sensing resistor is connected to a power supply; and
an inverting input end of the amplifier is connected to the first end of the sensing resistor, a non-inverting input end of the amplifier is connected to the second end of the sensing resistor, and an output end of the amplifier is connected to the output end of the current detection unit.

11. The system according to claim 8, wherein the voltage stabilizer is a linear stabilizer.

12. A method for power amplifier control, applied to a multi-stage power amplifier, wherein:
the multi-stage power amplifier comprises N amplification stages, and N≥2;
an input end of the first amplification stage is an input end of the multi-stage power amplifier, an output end of the first amplification stage is connected, directly or via at least one intermediate amplification stage, to an input end of the N-th amplification stage, and an output end of the N-th amplification stage is an output end of the multi-stage power amplifier;
the first amplification stage comprises a first triode;
the N-th amplification stage comprises an N-th triode;
a base of the first triode is connected to the input end of the multi-stage power amplifier, a collector of the first triode is connected to a first input voltage and connected, directly or via the at least one intermediate amplification stage, to a base of the N-th triode, and an emitter of the first triode is grounded;
a collector of the N-th triode is connected to an N-th input voltage and the output end of the multi-stage power amplifier, and an emitter of the N-th triode is grounded; and
the method comprises:
detecting a current at the base of the N-th triode to acquire a reference current value; and
controlling the first input voltage based on a change of the reference current value.

13. The method for power amplifier control according to claim 12, wherein the controlling the first input voltage based on a change of the reference current value comprises:
controlling the first input voltage to decrease, in a case that the reference current value increases; and
controlling the first input voltage to increase, in a case that the reference current value decreases.

* * * * *